United States Patent
Chen et al.

[11] Patent Number: 6,129,950
[45] Date of Patent: Oct. 10, 2000

[54] METHOD OF FORMING A THICK POLYSILICON LAYER

[75] Inventors: Weng-Yi Chen, Chupei; Kuen-Chu Chen, Hsinchu Hsien, both of Taiwan

[73] Assignee: United Microelectronics Corp., Hsinchu, Taiwan

[21] Appl. No.: 09/143,066
[22] Filed: Aug. 28, 1998
[30] Foreign Application Priority Data Jul. 8, 1998 [TW] Taiwan ................................ 87111030

[51] Int. Cl.⁷ .................................................... C23C 16/24
[52] U.S. Cl. ................ 427/255.18; 427/255.27; 427/255.29; 427/255.7; 427/99
[58] Field of Search .................. 427/255.18, 99, 427/255.7, 255.29, 255.4, 255.27; 438/488

[56] References Cited

U.S. PATENT DOCUMENTS

| | | | |
|---|---|---|---|
| 4,833,096 | 5/1989 | Huang et al. | 437/29 |
| 5,396,456 | 3/1995 | Liu et al. | 365/174 |

*Primary Examiner*—Roy V. King
*Attorney, Agent, or Firm*—Hickman Coleman & Hughes, LLP

[57] ABSTRACT

An apparatus and a method of forming a thick polysilicon layer are provided. An additional pipeline is introduced into a chamber that is used for depositing polysilicon layers. A thin silicon dioxide film is formed using oxygen after forming a first doped polysilicon layer with a constant thickness. Then a second doped polysilicon layer with a constant thickness is deposited on the thin silicon dioxide layer. The steps described above are repeated until a desired thickness is attained.

11 Claims, 1 Drawing Sheet

METHOD OF FORMING A THICK POLYSILICON LAYER

CROSS-REFERENCE TO RELATED APPLICATION

This application claims the priority benefit of Taiwan application serial no. 87111030, filed Jul. 8, 1998, the full disclosure of which is incorporated herein by reference.

BACKGROUND OF THE INVENTION

1. Field of the Invention

The invention relates in general to an apparatus and a method of fabricating semiconductor integrated circuits (ICs), and more particularly to an apparatus and a method of fabricating a polysilicon layer.

2. Description of the Related Art

Polysilicon is a pure material composed of single crystals of silicon grains that have various crystal orientations. In the other words, polysilicon is a pure material between crystal silicon and amorphous silicon. Grains in the polysilicon are separated from each other by a "grain boundary", which is a two dimensional defect. Since the grain boundary comprises many line defects and point defects, impurities permeate faster through the grain boundary than through the inner parts of the grains.

In modern very large scale integration (VLSI) processes, a polysilicon layer formed from heated and decomposed silane is deposited by low pressure chemical vapor deposition (LPCVD). If a reaction temperature is lower than 575° C., the deposited silicon is amorphous. When the reaction temperature is between 575° C. and 650° C., polysilicon is formed. The higher the reaction temperature, the more manifest the crystallinity of the silicon. Basically, if deposition temperature of polysilicon is too high, the polysilicon forms toward homogeneous nucleation, which makes the polysilicon even less uniform.

In addition, it takes a longer time to deposit a polysilicon layer with a thickness of 1000 Å. The longer time causes an annealing effect during the deposition and causes inclusions of particles in the deposited polysilicon layer as well as defects from homogeneous nucleation.

A conventional method of forming a thick polysilicon layer is provided to remove the particles and the defects described above. The polysilicon layer is formed using many steps of repeated deposition. A wafer is drawn from a chamber and cleaned between each deposition step. After the wafer is cleaned, it is put into the chamber, where continuous deposition is made on the wafer. An oxide film forms between the polysilicon layers while the wafer is placed in and taken out of the chamber. This oxide film can improve problems caused by particles and defects between polysilicon. However, repeatedly moving the wafer wastes much time and the additional step of cleaning makes the whole process complicated.

SUMMARY OF THE INVENTION

It is therefore an object of the invention to provide an improved and simplified apparatus and a method of forming a thick polysilicon layer, which doesn't comprise particles and defects. A wafer is put in a chamber until a deposition reaction on the wafer is finished without any extra cleaning step. The method eminently decreases the reaction time and simplifies the process steps.

The invention achieves the above-identified objects by providing an apparatus and a method of forming a thick polysilicon layer. An additional pipeline is introduced into a chamber that is used for depositing polysilicon layers. A thin silicon dioxide film is formed using oxygen after forming a first doped polysilicon layer with a constant thickness. Then, a second doped polysilicon layer with constant thickness is deposited onto the thin silicon dioxide layer. The steps described above are repeated until a desired thickness is attained.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
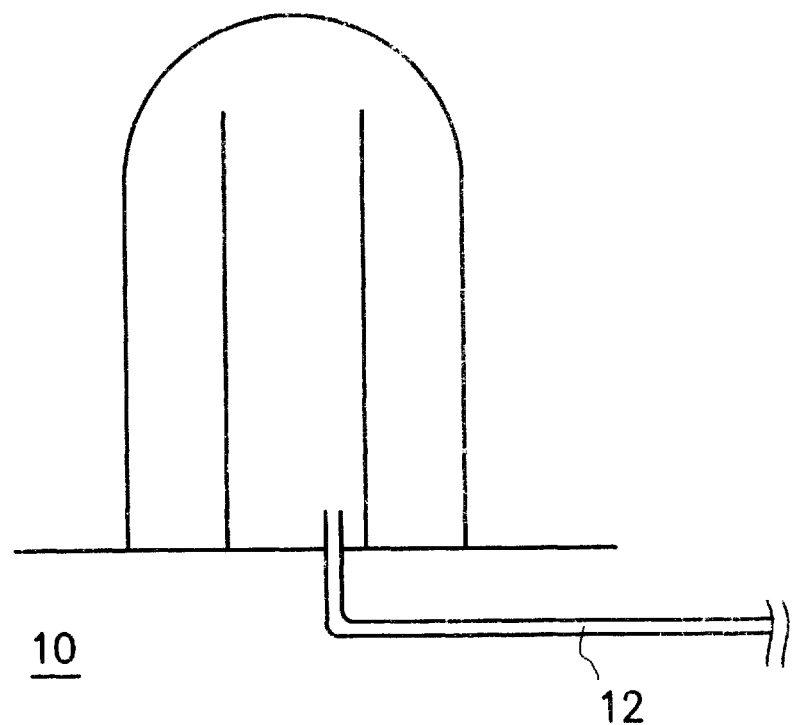
FIG. 1 is a diagram showing one preferred embodiment of this invention for forming a thick polysilicon layer.

A polysilicon layer with a thickness of about 10,000 Å undergoes and annealing effect due to its long deposition time. This invention incorporates a pipeline 12 for carrying oxygen into a depositing chamber 10 shown in FIG. 1.

Figure 2:
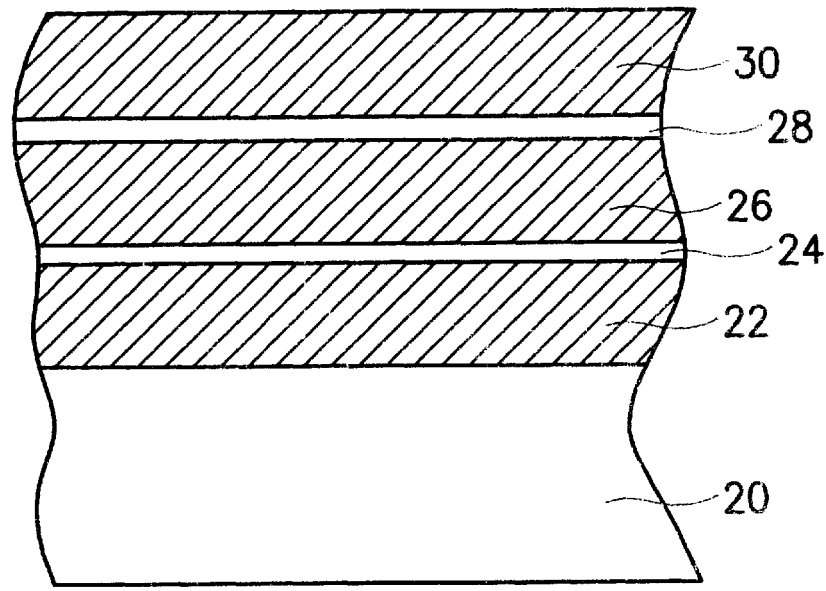
FIG. 2 is a cross-sectional view showing a structure of one preferred embodiment of the method of forming the thick polysilicon layer.

The steps of forming the polysilicon layer are described below. First, referring to FIG. 2. a substrate 20 is put into the depositing chamber 10 so that a first doped polysilicon layer 22 can be deposited on it. The first doped polysilicon layer 22 is for example, by LPCVD with silane as a reactive source and has a thickness of about 3000–5000 Å. Then, the deposition is stopped, and a non-reactive gas such as nitrogen is introduced into the depositing chamber 10 to ensure that there is no residual silane in the depositing chamber 10. An oxidative gas such as oxygen or a mixture gas of oxygen and nitrogen is introduced into the depositing chamber 10 through the pipeline 12 to form a thin first oxide layer 24 with a thickness of about 5–20 Å on the first doped polysilicon layer 22. The non-reactive gas is continually carried into the depositing chamber 10 after the oxidative gas is stopped to ensure that there is no oxidative gas remaining in the depositing chamber 10.

Those steps described above arc repeated. A second doped polysilicon layer 26, a second oxide layer 28 and a third doped polysilicon layer 30 are formed until the total thickness of these polysilicon layers matches the required amount.

One feature of this invention is the provision of an apparatus for forming a thick polysilicon layer. A pipeline for carrying oxygen is installed easily in a conventional chemical vapor deposition system without affecting the system.

Another feature of this invention to form thin oxide films in a thick polysilicon layer to prevent particles and defects from forming in the polysilicon layer due to the annealing effect and the homogeneous nucleation which occur during the long process time.

A conventional method of forming a thick polysilicon layer without particles and defects is to deposit many times and to repeatedly move the chip in and out of the chamber. Furthermore, the conventional method comprises a step of cleaning. That not only make the process complicated; it also wastes a lot of time. Another feature of this invention that it saves a lot of time by adding the pipeline for carrying oxygen.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a thick polysilicon layer by using a chemical vapor deposition system, the method comprising the steps of:

providing a substrate;

introducing a first gas to form a first doped polysilicon layer on the substrate;

stopping the first gas;

introducing a second gas into the chemical vapor deposition system to ensure that no residual first gas lingers in the system;

introducing a third gas after the second gas to form a first oxide layer having a thickness of about 5–20 Å on the first doped polysilicon layer;

stopping the third gas;

introducing the second gas into the chemical vapor deposition system to ensure that no residual third gas lingers in the system; and repeating the steps described above to form a doped second polysilicon layer, a second oxide layer having a thickness of about 5–20 Å and a doped third polysilicon layer.

2. The method according to claim 1, wherein the first gas comprises silane.

3. The method according to claim 1, wherein the second gas comprises nitrogen.

4. The method according to claim 1, wherein the third gas comprises oxygen.

5. The method according to claim 1, wherein the third gas comprises oxygen and nitrogen.

6. The method according to claim 1, wherein the first doped polysilicon layer, the second doped polysilicon layer and the third doped polysilicon layer each have a thickness of about 3000–5000 Å.

7. A method of forming a thick polysilicon layer by using a chemical vapor deposition system, the method comprising the steps of:

providing a substrate;

introducing a gas comprising silane to form a first doped polysilicon layer on the substrate;

stopping the gas comprising silane;

introducing a non-reactive gas into the chemical vapor deposition system to ensure that no residual gas comprising silane lingers in the system;

introducing an oxidative gas after the non-reactive gas to form a first oxide layer having a thickness of about 5–20 Å on the first doped polysilicon layer;

stopping the oxidative gas;

introducing the non-reactive gas into the chemical vapor deposition system to ensure that no residual oxidative gas lingers in the system; and repeating the steps described above to form a doped second polysilicon layer, a second oxide layer having a thickness of about 5–20 Å and a doped polysilicon layer.

8. The method according to claim 7, wherein the non-reactive gas comprises nitrogen.

9. The method according to claim 7, wherein the oxidative gas comprises oxygen.

10. The method according to claim 7, wherein the oxidative gas comprises oxygen and nitrogen.

11. The method according to claim 7, wherein the first doped polysilicon layer, the second doped polysilicon layer and the third doped polysilicon layer each have a thickness of about 3000–5000 Å.

* * * * *